(12) United States Patent
Borg et al.

(10) Patent No.: US 10,411,092 B2
(45) Date of Patent: Sep. 10, 2019

(54) FABRICATION OF SEMICONDUCTOR JUNCTIONS

(71) Applicant: INTERNATIONAL BUSINESS MACHINES CORPORATION, Armonk, NY (US)

(72) Inventors: Mattias B. Borg, Rueschlikon (CH); Kirsten E. Moselund, Rueschlikon (CH); Heike E. Riel, Rueschlikon (CH); Heinz Schmid, Rueschlikon (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 259 days.

(21) Appl. No.: 15/445,145

(22) Filed: Feb. 28, 2017

(65) Prior Publication Data
US 2017/0170271 A1 Jun. 15, 2017

Related U.S. Application Data

(62) Division of application No. 14/953,117, filed on Nov. 27, 2015, now Pat. No. 9,620,360.

(51) Int. Cl.
*H01L 29/06* (2006.01)
*H01L 21/02* (2006.01)
(Continued)

(52) U.S. Cl.
CPC ...... *H01L 29/0688* (2013.01); *H01L 21/0262* (2013.01); *H01L 21/02381* (2013.01);
(Continued)

(58) Field of Classification Search
CPC ............... H01L 21/02647; H01L 51/56; H01L 29/0688; H01L 31/035281; H01L 33/24;
(Continued)

(56) References Cited

U.S. PATENT DOCUMENTS 5,360,754 A * 11/1994 Pribat ..................... C30B 25/18
117/90
9,620,360 B1 * 4/2017 Borg ................. H01L 21/02647
(Continued)

OTHER PUBLICATIONS

List of IBM Patents or Patent Applications Treated as Related; (Appendix P), Filed Jun. 14, 2017; 2 pages.
(Continued)

*Primary Examiner* — Charles D Garber
*Assistant Examiner* — S M Sohel Imtiaz
(74) *Attorney, Agent, or Firm* — Cantor Colburn LLP; Daniel Morris

(57) ABSTRACT

A method comprises providing a cavity structure on the substrate comprising a first growth channel extending in a first direction, a second growth channel extending in a second direction, wherein the second direction is different from the first direction and the second channel is connected to the first channel at a channel junction, a first seed surface in the first channel, at least one opening for supplying precursor materials to the cavity structure, selectively growing from the first seed surface a first semiconductor structure substantially only in the first direction and in the first channel, thereby forming a second seed surface for a second semiconductor structure at the channel junction, growing in the second channel the second semiconductor structure in the second direction from the second seed surface, thereby forming the semiconductor junction comprising the first and the second semiconductor structure.

6 Claims, 9 Drawing Sheets

(51) Int. Cl.
  *H01L 29/66* (2006.01)
  *H01L 29/78* (2006.01)
  *H01L 21/306* (2006.01)
  *H01L 31/0352* (2006.01)
  *H01L 33/24* (2010.01)

(52) U.S. Cl.
  CPC .. *H01L 21/02546* (2013.01); *H01L 21/02549* (2013.01); *H01L 21/02645* (2013.01); *H01L 21/02647* (2013.01); *H01L 21/30604* (2013.01); *H01L 29/0684* (2013.01); *H01L 29/0692* (2013.01); *H01L 29/66795* (2013.01); *H01L 29/78* (2013.01); *H01L 29/785* (2013.01); *H01L 31/035281* (2013.01); *H01L 33/24* (2013.01); *H01L 21/02463* (2013.01)

(58) Field of Classification Search
  CPC ........... H01L 21/02546; H01L 29/0692; H01L 21/02381
  See application file for complete search history.

(56) References Cited

U.S. PATENT DOCUMENTS

| | | | | |
|---|---|---|---|---|
| 2005/0023619 A1* | 2/2005 | Orlowski | .......... | H01L 29/42384 257/401 |
| 2005/0202607 A1* | 9/2005 | Furukawa | ......... | H01L 29/66545 438/157 |
| 2008/0042219 A1* | 2/2008 | Booth, Jr. | ......... | H01L 29/66795 257/401 |
| 2008/0290402 A1* | 11/2008 | Chung | ............ | H01L 21/823418 257/327 |
| 2012/0168854 A1* | 7/2012 | Jang | .................. | H01L 27/10876 257/329 |
| 2012/0319190 A1* | 12/2012 | Zhu | ................... | H01L 29/66803 257/329 |
| 2013/0313583 A1* | 11/2013 | Hwang | ................... | H01L 33/08 257/88 |
| 2015/0129983 A1* | 5/2015 | Yu | ....................... | H01L 29/7848 257/401 |
| 2016/0005731 A1* | 1/2016 | Chen | ................... | H01L 27/0629 257/300 |
| 2016/0017515 A1* | 1/2016 | Han | ....................... | C30B 25/16 117/95 |
| 2016/0049511 A1* | 2/2016 | Kim | ................... | H01L 29/7848 257/401 |
| 2016/0293485 A1* | 10/2016 | Song | ................ | H01L 21/32139 |

OTHER PUBLICATIONS

Mattias B. Borg et al. "Fabrication of Semiconductor Junctions", U.S. Appl. No. 14/953,117, Nov. 27, 2015, U.S. Pat. No. 9,620,360, Apr. 11, 2017.

* cited by examiner

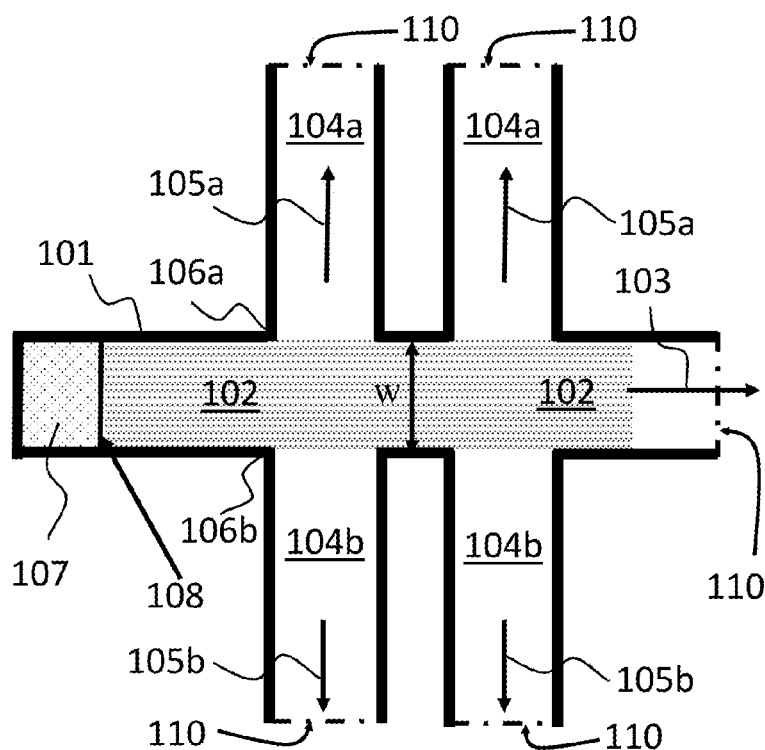
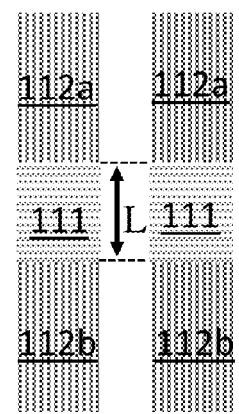
Figure 3a    Figure 3b
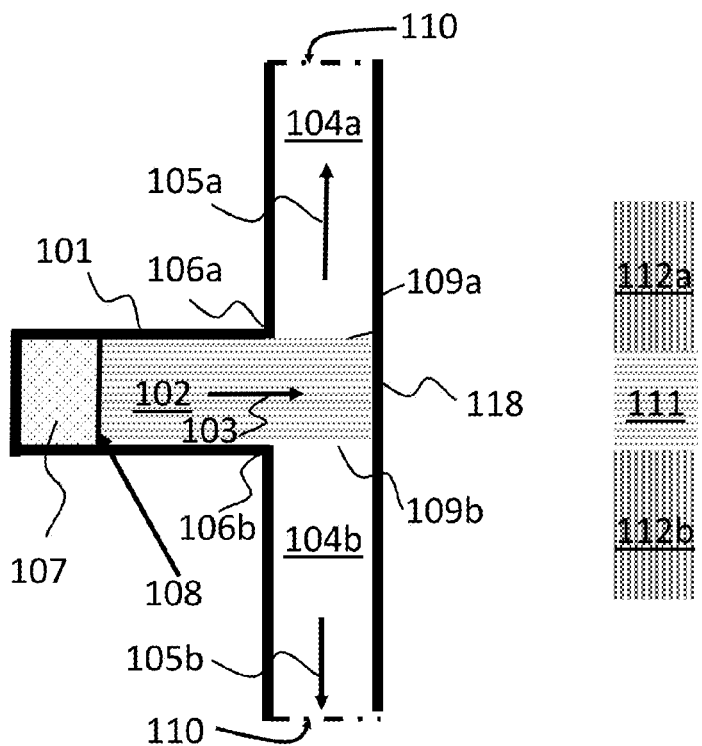
Figure 4a    Figure 4b

FABRICATION OF SEMICONDUCTOR JUNCTIONS

PRIORITY

This application is a divisional of U.S. Non-Provisional application Ser. No. 14/953,117, entitled "FABRICATION OF SEMICONDUCTOR JUNCTIONS", filed Nov. 27, 2015, which is incorporated herein by reference in its entirety

BACKGROUND

This invention relates to fabrication of semiconductor junctions and provides methods for fabricating semiconductor junctions on a substrate. The invention relates also to corresponding semiconductor structures obtainable by such methods.

It is known that semiconductor structures can be formed by patterning trenches of the desired shape on a substrate and then depositing semiconductor material to fill the trenches. A fundamental problem with the patterned-trench technique is that defects tend to occur in the resulting crystal structure of the semiconductor. One technique to restrict these defects, known as aspect ratio trapping (ART), involves controlling the aspect ratio of a trench defined between sidewalls of a mask such that dislocations in the semiconductor structure formed in the trench tend to terminate at the mask sidewalls. Defects are then inhibited in an upper region of the semiconductor structure above the dislocations.

Defects have also been reduced in semiconductor structures using the technique of confined epitaxial layer overgrowth (ELO). With this technique, planar semiconductor structures have been grown laterally (i.e. generally parallel to the plane of the substrate) from seeds in the form of elongate stripes of monocrystalline semiconductor material. Selective epitaxial growth proceeds laterally from the seed stripes in tunnel areas defined between upper and lower confining surfaces.

An improved technique for fabrication of semiconductor junctions would be highly desirable.

SUMMARY

According to a first aspect, the invention is embodied as a method for fabricating a semiconductor junction on a substrate. The method comprises a step of providing a cavity structure on the substrate. The cavity structure comprises a first growth channel extending in a first direction and a second growth channel extending in a second direction. The second direction is different from the first direction and the second channel is connected to the first channel at a channel junction. The cavity structure comprises furthermore a first seed surface in the first channel and at least one opening for supplying precursor materials to the cavity structure. The method further comprises a step of selectively growing from the first seed surface a first semiconductor structure substantially only in the first direction and in the first channel, thereby forming a second seed surface for a second semiconductor structure at the channel junction. The method further comprises a step of growing in the second channel the second semiconductor structure in the second direction from the second seed surface, thereby forming the semiconductor junction comprising the first and the second semiconductor structure.

Methods according to embodiments of the first aspect may facilitate an efficient and precise fabrication of semiconductor junctions. As the first semiconductor structure is substantially only grown in the first channel, the second seed surface and therewith the position and direction of the semiconductor junction is aligned to the first channel. In other words, according to methods of the first aspect the cavity structure can be used to determine and control the position of the semiconductor junction. Hence methods according to embodiments of the invention may allow the fabrication of self-aligned semiconductor junctions. Furthermore, methods embodying the invention facilitate the fabrication of semiconductor junctions without an additional lithography step.

According to a preferred embodiment the growing of the first and the second semiconductor structure is performed by vapor phase epitaxy, in particular by metalorganic chemical vapor deposition (MOCVD) or hydride vapor phase epitaxy. Vapor phase epitaxy and in particular MOCVD and hydride vapor phase epitaxy allow a precise control of the growing conditions of the first and the second semiconductor structure. Furthermore, they allow mass manufacturing. According to preferred embodiments the semiconductor junction may be fabricated just with two epitaxial sub-steps without an intermediate lithography step. Saving a lithography step may reduce the total fabrication costs significantly.

According to a preferred embodiment the crystal orientation of the first seed surface and one or more parameters of the vapor phase epitaxy are adapted to grow the first semiconductor structure anisotropically in the first direction only. This allows a very precise and directed control of the growth of the first semiconductor structure. Parameters of the vapor phase epitaxy may be e.g. the process temperature, the used precursor materials, the amount of the precursor materials and the mixing ratio of the precursor materials.

According to a preferred embodiment the crystal orientation of the second seed surface and one or more parameters of the vapor phase epitaxy are adapted to grow the second semiconductor structure in the second direction. This facilitates a precise and directed control of the growth of the second semiconductor structure. Parameters of the vapor phase epitaxy may be again e.g. the process temperature, the used precursor materials, the amount of the precursor materials and the mixing ratio of the precursor materials. The parameters for growing the second semiconductor structure are different from the parameters for growing the first semiconductor structure according to embodiments of the invention. In other words, a first set of parameters may be used for the growth of the first semiconductor structure while a second set of parameters that is different from the first set of parameters may be used for the growth of the second semiconductor structure.

According to a preferred embodiment the first direction and the second direction are substantially perpendicular to each other. Such a perpendicular arrangement is advantageous for many device structures and facilitates area efficient designs.

According to preferred embodiments the cavity structure comprises a plurality of second growth channels. The plurality of second growth channels are arranged in parallel to each other and substantially perpendicular to the first channel. Such a cavity structure may facilitate the efficient fabrication of a plurality of semiconductor junctions. More particularly, according to a further preferred embodiment the method comprises growing a plurality of second semiconductor structures simultaneously in the plurality of second growth channels, thereby forming simultaneously a plurality of semiconductor junctions.

Such an embodiment facilitates the simultaneous fabrication of a plurality of semiconductor junctions just with two subsequent epitaxial growth steps, but without any lithography step between the two epitaxial growth steps.

According to another preferred embodiment the cavity structure comprises one or more pairs of second growth channels. Each pair comprises a first arm and a second arm and the first arm and the second arm extend from a channel junction in opposite directions. With such a structure second semiconductor structures may be grown simultaneously in the first arm and the second arm of the one or more pairs of second growth channels. As a result, one or more double semiconductor junctions may be formed simultaneously in an efficient and precise way. In particular, both semiconductor junctions of the one or more double junctions are self-aligned to the first growth channel. Hence the double-semiconductor junction can be manufactured precisely and efficiently.

According to another preferred embodiment the double-semiconductor junctions may be used to fabricate a transistor. Preferably the first semiconductor structure forms the basis for one or more gate channel structures of the transistor, the second semiconductor structure of the first arm forms the basis for a drain structure of the transistor and the second semiconductor structure of the second arm forms the basis for a source structure of the transistor. This is an elegant, simple, efficient and precise way to fabricate transistor structures.

According to preferred embodiments each of the first and the second semiconductor structures may comprises a compound semiconductor material. According to other preferred embodiments the first and the second semiconductor structures may comprise the same compound semiconductor material, but with different dopings. According to other preferred embodiments the first and the second semiconductor structures comprise different compound semiconductor materials. This allows fabricating hetero-junctions.

While in general any desired dimensions for the first and the second growth channel may be chosen, in preferred embodiments the first and/or the second growth channel are formed as a nanotube. This may facilitate the desired directed and anisotropic growth. The first seed surface may furthermore preferably embodied as a monocrystalline semiconductor surface to facilitate directed and anisotropic growth.

According to preferred embodiments the first seed surface has an area of order $10^4$ nm$^2$ or less. Such a small seed may facilitate defect free growth.

According to another aspect a semiconductor device comprising a semiconductor junction is provided. The semiconductor junction comprises a first semiconductor structure substantially grown in a first direction and a second semiconductor structure substantially grown in a second direction from a seed surface of the first semiconductor structure. The second direction is preferably substantially perpendicular to the first direction.

Devices having such semiconductor junctions may be manufactured in an efficient and precise way with self-alignment of the junction. Such devices may allow complete new circuit designs, structures, integration and stacking.

According to another aspect a transistor is provided. The transistor comprises a gate structure substantially grown in a first direction, a drain structure substantially grown in a second direction from a seed surface of the gate structure and a source structure substantially grown in a third direction from another seed surface of the gate structure. The first direction is substantially perpendicular to the second and the third direction. The third direction may be in particular the opposite of the second direction.

Such transistors may be manufactured in an efficient and precise way with self-alignment of the junction between the gate structure and the source and drain structures. Such transistors devices may allow complete new circuit designs, structures, integration and stacking.

According to another aspect of the invention a semiconductor device is provided that is obtainable by a method according to the first aspect.

Embodiments of the invention will be described in more detail below, by way of illustrative and non-limiting examples, with reference to the accompanying drawings.

BRIEF DESCRIPTION OF THE DRAWINGS

FIG. 3a shows another embodiment of a cavity structure used in fabrication methods embodying the invention;

FIG. 3b shows a device structure fabricated with the cavity structure of FIG. 3a;

FIG. 4a shows an embodiment of another cavity structure used in fabrication methods embodying the invention;

FIG. 4b shows a device structure fabricated with the cavity structure of FIG. 4a;

FIG. 7a shows another embodiment of a cavity structure having a L-shape with only a single channel junction;

FIG. 7b shows a device structure fabricated with the cavity structure of FIG. 7a;

DETAILED DESCRIPTION

At first, some general aspects and terms of embodiments of the invention are described.

The term cavity structure may be defined as a hollow, partly filled or filled structure that is formed by a solid surrounding, e.g. surroundings walls. The cavity structure is adapted for enclosing, guiding and/or confining materials during the fabrication process of the semiconductor structure, in particular materials in a fluid and/or gaseous form. According to embodiments of the invention the cavity structure has one more openings through which precursor materials can be supplied to the cavity structure. The cavity structure may be in particular adapted to confine and guide materials of a vapor phase epitaxial process from the one or more openings to the first and the second seed surface to initiate crystal growth.

The first growth direction may be according to embodiments a lateral direction extending laterally over a substrate. The term "laterally" is used in this context to indicate orientation generally parallel to the plane of the substrate, as opposed to generally vertically, or outwardly, from the substrate surface. According to other embodiments the first direction may be a direction that is vertically to the surface of the substrate.

Figure 1A:
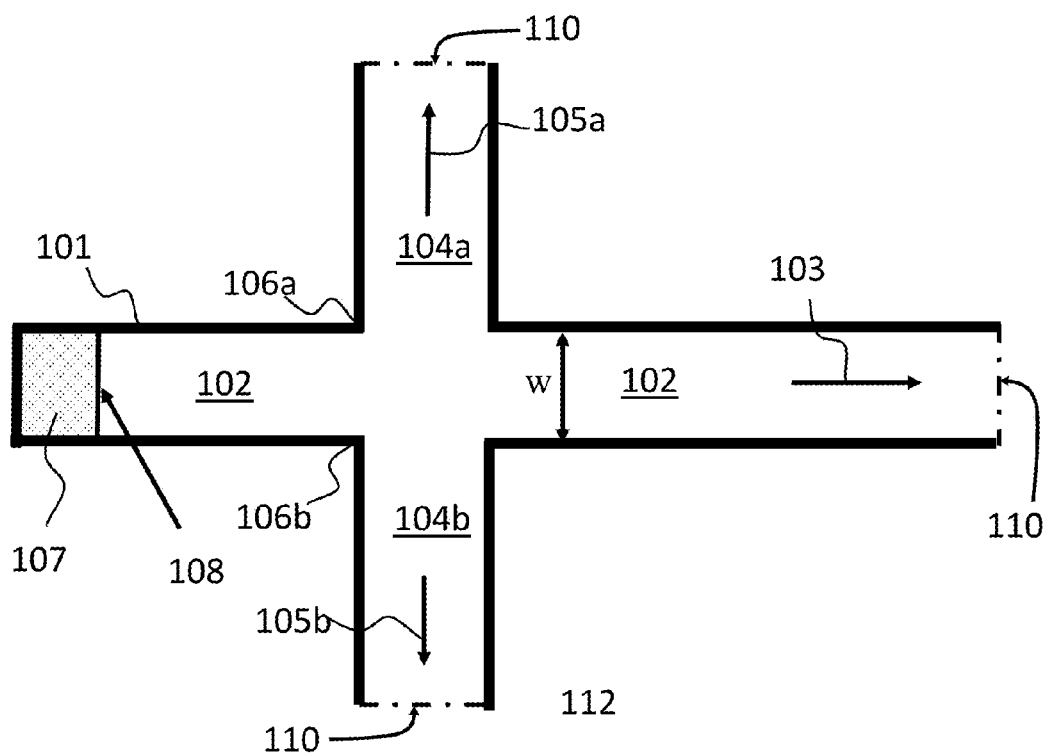
FIGS. 1a through 1h are schematic illustrations showing successive stages in a fabrication method embodying the invention.
Figure 1B:
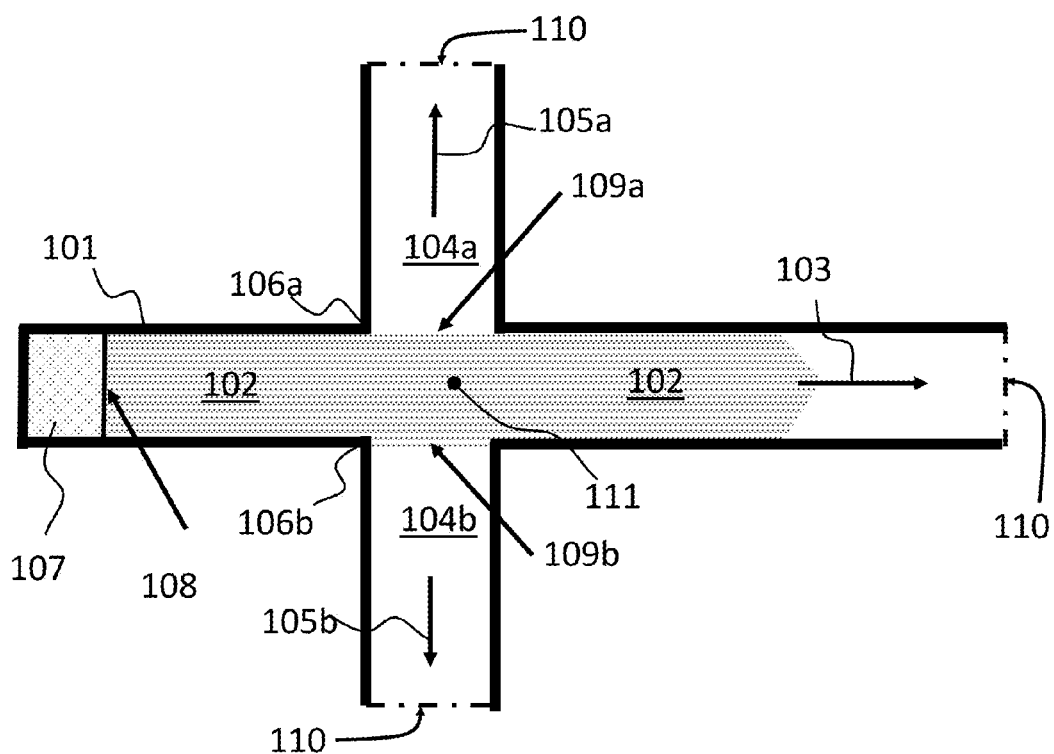
Figure 1C:
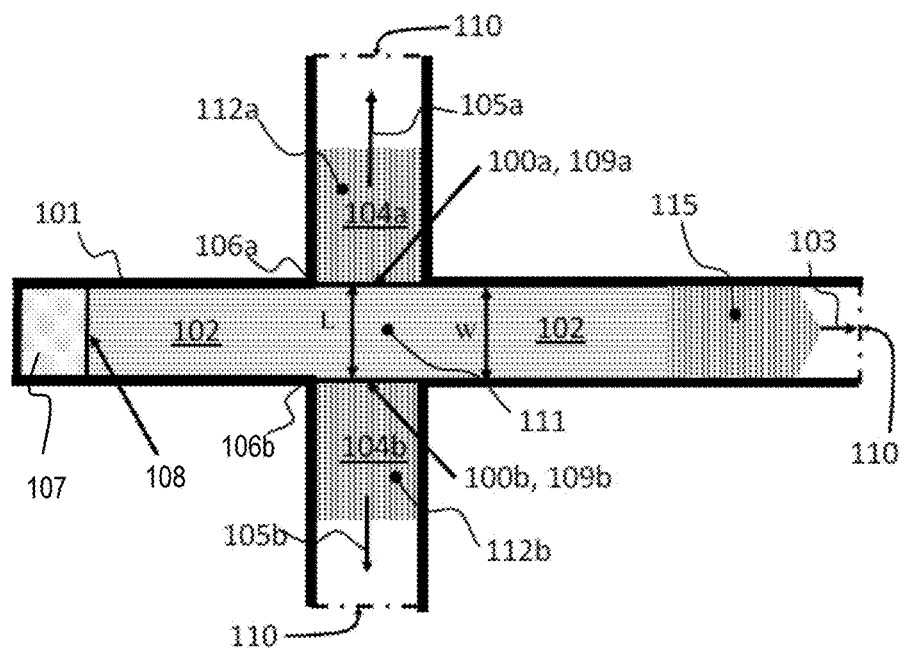
Figure 1D:
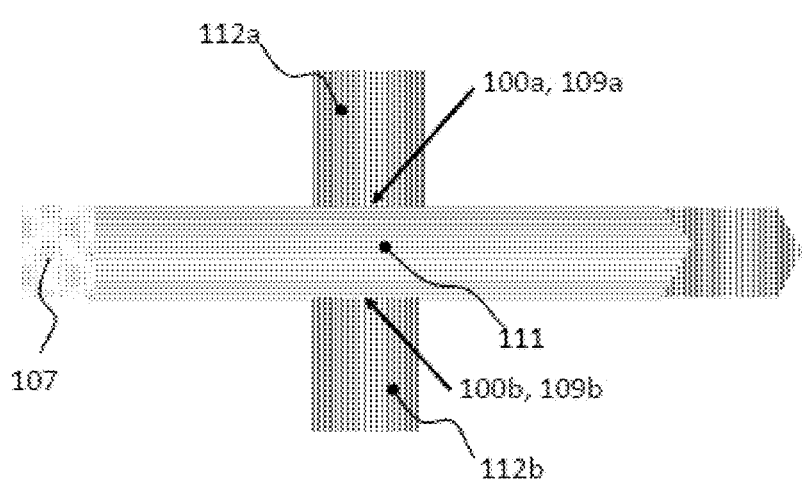
Figure 1E:
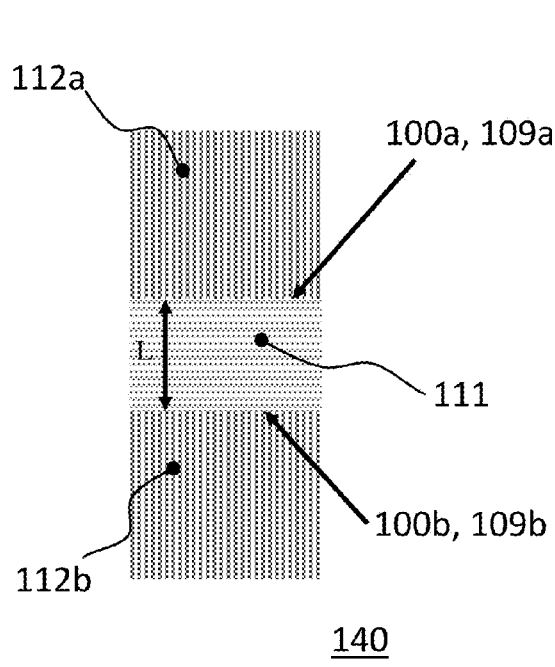
Figure 1F:
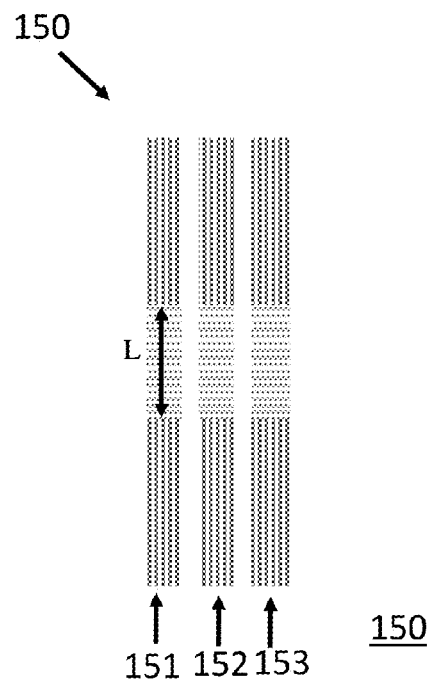
Figure 1G:
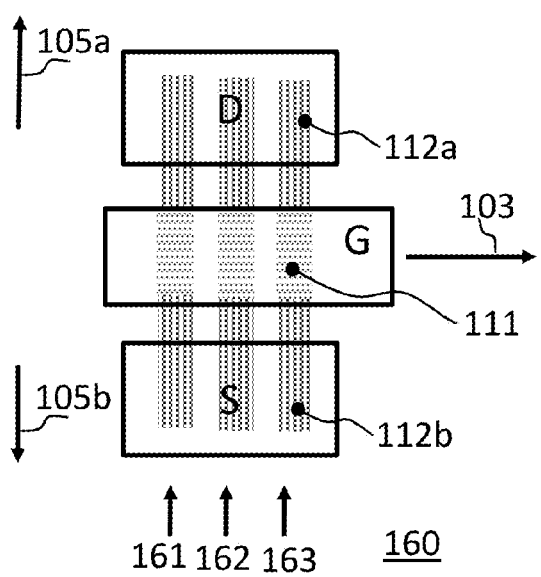
Figure 1H:
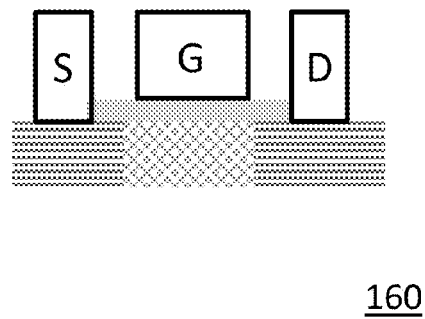

FIG. 1a through 1h show successive stages of a method for fabrication of semiconductor junctions according to embodiments of the invention. FIG. 1a through 1g are schematic top views while FIG. 1h is a side view.

FIG. 1a is a schematic top view of a cavity structure 101 that comprises a first growth channel 102 extending in a first direction 103, a second growth channel 104a extending in a second direction 105a and a second growth channel 104b extending in a second direction 105b. The second direction 105a is different from the first direction 103 and according to this embodiment perpendicular to the first direction 103. The second direction 105b is also different from the first direction 103 and according to this embodiment perpendicular to the first direction 103. The second growth channel 104a is connected to the first channel 102 at a channel junction 106a. The second growth channel 104b is connected to the first channel 102 at a channel junction 106b. At the left end of the first growth channel 102 there is arranged a first semiconductor seed 107 having a first seed surface 108. The second growth channels 104a and 104b form a pair of second growth channels that comprise the second growth channel 104a as a first arm and the second growth channel 104b as a second arm. The first arm and the second arm extend from the channel junctions 106a/106b in different directions and in this exemplary embodiment in opposite directions.

The first seed surface 108 may be in particular a monocrystalline semiconductor surface. According to one embodiment the first seed 107 and accordingly the first seed surface 108 may comprise silicon. The first seed surface 108 is substantially perpendicular to the longitudinal axis of the first channel 102 which corresponds to the first direction 103, The first growth channel 102 and the second growth channels 104a and 104b comprise openings 110. The openings 110 may be used to apply a precursor material, e.g. by a vapor phase epitaxy apparatus, to the cavity structure 101.

While in this exemplary embodiment the first growth channel and the second growth channels have rectangular shapes, the first growth channel and/or the second growth channels may have varying widths and heights and may have curved shapes according to other embodiments.

Referring now to FIG. 1b, the first growth channel 102 comprises a first semiconductor structure 111 which was selectively grown from the first seed surface 108 substantially only in the first direction 103 and substantially only in the first channel 102. In particular, the first semiconductor structure 111 is grown at the channel junctions 106a and 106b only in the first direction 103, but not in the second directions 105a and 105b so that the first semiconductor structure 111 does not extend into the second growth channels 104a and 104b. "Substantially" in this context shall mean that small deviations from the directed growth in the first direction and in particular a small extension of the first semiconductor structure 111 into the second channel may be tolerated according to embodiments of the invention. The requirements on the accuracy may be in particular determined by the accuracy needed for the respective device applications of the semiconductor junctions. However, according to embodiments of the invention the first semiconductor structure may not extend into the second channel by more than 50 nm, and most preferably not more than 5 nm.

By this anisotropic directed growth a second seed surface 109a is formed by the first semiconductor structure 111 at the channel junction 106a and another second surface 109b at the channel junction 106b. The second seed surfaces 109a and 109b are aligned to and defined by the cavity structure 101 of the first growth channel 102. The second seed surfaces 109a and 109b extend in parallel to the first direction 103. Furthermore, the second seed surfaces 109a and 109b are substantially perpendicular to the longitudinal axis of the second channels 104a and 104b corresponding to the second directions 105a and 105b respectively.

The growing of the first semiconductor structure 111 may be performed by vapor phase epitaxy, in particular by MOCVD or hydride vapor phase epitaxy. To ensure the directed and anisotropic growth of the first semiconductor structure 111 in the first direction 103 only, the crystal orientation of the first seed surface 108 and one or more parameters of the vapor phase epitaxy can be appropriately chosen. How to ensure such a directed growth is generally known to a skilled person in the art. Important parameters are e.g. the process temperature, the type and amount of the precursor materials and the mixing ratio of the elements of the precursor material. Details on such directed growth are e.g. described in Shaw, D. W. J. Electrochem. Soc., Vol 115, No. 4, 1968.

Referring now to FIG. 1c, the cavity structure 101 comprises a second semiconductor structure 112a that has been grown in the second channel 104a in the second direction 105a from the second seed surface 109a. Furthermore, the cavity structure 101 comprises a second semiconductor structure 112b that has been grown in the second channel 104b in the second direction 105b from the second seed surface 109b. As a result, a semiconductor junction 100a has been formed between the first semiconductor structure 111 and the second semiconductor structure 112a. Furthermore, another semiconductor junction 100b has been formed between the first semiconductor structure 111 and the second semiconductor structure 112b. The first channel 102 comprises furthermore a semiconductor structure 115 that has been grown in the first direction simultaneously with the second semiconductor structures 112a and 112b.

In general the first and the second semiconductor structures may comprise any desired semiconductor materials. In preferred embodiments the first semiconductor structure and the second semiconductor structure comprise a compound semiconductor material. A compound semiconductor material includes a III-V compound semiconductor material, a II-VI compound semiconductor material and/or a IV-IV compound semiconductor material. In particular, indium gallium arsenide, indium arsenide and/or gallium arsenide may be used in view of a higher carrier mobility than silicon, thereby allowing fast semiconductor devices. In preferred embodiments, the first and the second semiconductor structure comprise different compound semiconductor materials. This allows forming of semiconductor heterojunctions between the first and the second semiconductor structure. According to other preferred embodiments the first and the second semiconductor structures comprise the same compound semiconductor material with different doping. This allows forming of p-n junctions or homojunctions between first and second semiconductor structures. Nevertheless, in general junctions may be formed according to embodiments between structures of any desired semiconductor materials.

Also, material composition and/or dopant levels may be varied during the growth processes if desired.

Referring now to FIG. 1d, a semiconductor structure is shown for which the cavity structure 101 has been removed, e.g. by etching. Then, in another fabrication step, the result of which is illustrated in FIG. 1e, any desired part of the semiconductor structure may be removed, e.g. by etching. The structure shown in FIG. 1e is a double semiconductor junction 140 comprising the second semiconductor structure 112a on the top, the first semiconductor structure 111 in the middle and the second semiconductor structure 112b in the bottom. The double semiconductor junction 140 has been formed in a preferred rectangular form and more particularly as a rectangular block.

In general, the structure 140 may be further processed in any desired way.

According to one preferred embodiment as illustrated in FIG. 1f a fin structure 150 is formed from the semiconductor junction 140 by selective etching. This results in this example in three parallel fins 151, 152 and 153. Each of the fins 151, 152 and 153 comprises a double semiconductor junction.

According to a preferred embodiment the fin structure 150 may be used to fabricate a transistor array structure 160 comprising three transistors 161, 162 and 163 as shown in FIG. 1g. As can be seen the first semiconductor structures 111 may be used as gate channel structures and are hence connected with gate electrodes G. The second semiconductor structures 112a may form the basis for drain structures of the transistors 161, 162 and 163 and are hence connected to drain electrodes D. The second semiconductor structures 112b may form the basis for source structures of the transistors 161, 162 and 163 and are connected to source electrodes S. The gate structures of the transistors are substantially grown in the first direction 103. The drain structures are substantially grown in a second direction 105a from a seed surface of the gate structure and the source structures are substantially grown in a opposite second direction 105b, also denoted as third direction, from another seed surface of the gate structure.

FIG. 1h shows a corresponding side view of the transistor array structure 160 of FIG. 1g.

With the method as described above three field effect transistors 161, 162 and 163 have been fabricated with source drain structures 112a and 112b respectively that are self-aligned to the gate channel structure 111.

Accordingly, the above fabrication method allows controlled and precise fabrication of semiconductor junctions. In particular, the position and geometry of the semiconductor junction is determined by the position and geometry of the channel junctions. The length L of the first semiconductor structure 111 is determined by and can be precisely controlled by the width W of the first growth channel 102. Hence the length L of the first semiconductor structure 111 is self-aligned to the first growth channel 102. Hence methods according to embodiments of the invention offer accuracy in device fabrication facilitate improved construction and may provide enhanced device characteristics.

As a result, semiconductor devices may be manufactured that make use of a new semiconductor junction structure that is characterized by at least two semiconductor structures which have been grown in different directions and preferably in perpendicular directions. Furthermore, a side plane of the first semiconductor structure is used as seed surface for the growth of the second semiconductor structure. Such a junction formed by crystal growth in directions perpendicular to each other is substantially different from conventional semiconductor processing techniques according to which junctions are formed by growing structures in the same direction or by arranging semiconductor layers on top of each other with corresponding lithography steps. In other words, according to fabrication methods according to embodiments of the invention semiconductor junctions may be fabricated that are grown "around a corner", wherein the "corner" is defined by the channel junctions, e.g. the channel junctions 106a and 106b.

Figure 2A:
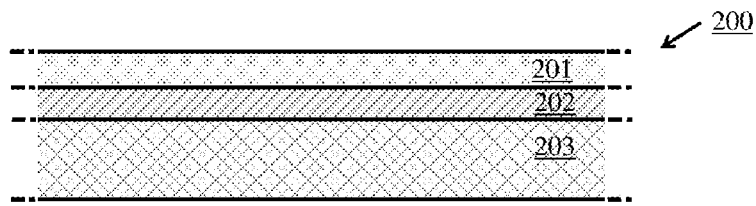
FIGS. 2a through 2h are schematic illustrations showing more detailed stages in a fabrication method of a cavity structure embodying the invention.
Figure 2B:
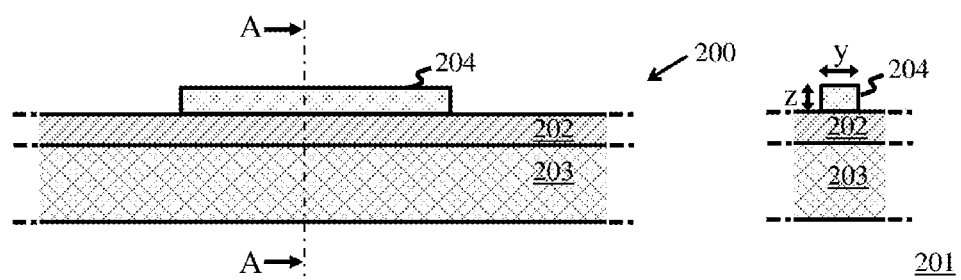

An exemplary fabrication method of the cavity structure 101 will now be described in more detail with reference to FIGS. 2a through 2g. FIG. 2a is a schematic cross-section through a SOI (Silicon On Insulator) wafer 200 which provides the substrate for this fabrication process. Wafer 200 comprises three layers. A thin, typically 10-200 nm thick, Si device layer 201 is bonded or deposited on a silicon oxide dielectric layer 202 which in turn overlies a thick silicon handle wafer 203. The Si device layer 201 with (100) surface orientation provides a seed material layer for the first seed of the fabrication method. In a first step of the method the Si layer 201 is patterned to form a silicon nanowire 204 as shown in FIG. 2b. The nanowire 204 provides the basis for the first seed 107 for the first semiconductor structure 111 and is shaped to define the interior of the first growth channel 102 to be formed in subsequent steps. This initial patterning step exposes the dielectric layer 202 around nanowire 204 and may involve reducing the thickness of device layer 201 according to the desired dimensions of the first growth channel and the second growth channel to be formed. The resulting nanowire 204 of a first seed material for the first seed thus projects from dielectric layer 202. In this simple example, the nanowire 204 is of uniform rectangular cross-section as illustrated on the right-hand side of FIG. 2b which shows a schematic cross-section on A-A of the left-hand view in the figure. Each of dimensions y, z in this example may be less than 100 nm. However, generally any other shapes and dimensions may be used as desired.

Figure 2C:
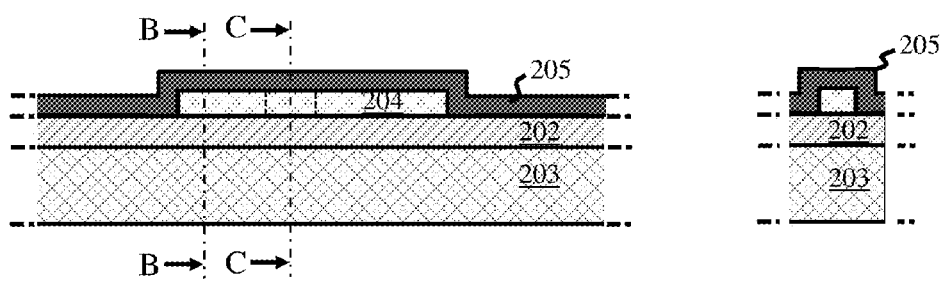

In a second step of the fabrication process of the cavity structure 101, a second dielectric layer 205, e.g. of silicon oxide, is deposited over, and in contact with, the nanowire 204 and the first dielectric layer 202. The result of this step is illustrated in FIG. 2c, where the right-hand view shows a cross-section on B-B of the left-hand view in the figure. FIG. 2e shows a cross-section on C-C of the left-hand view of FIG. 2c to illustrate the second growth channels 104a and 104b.

Figure 2D:
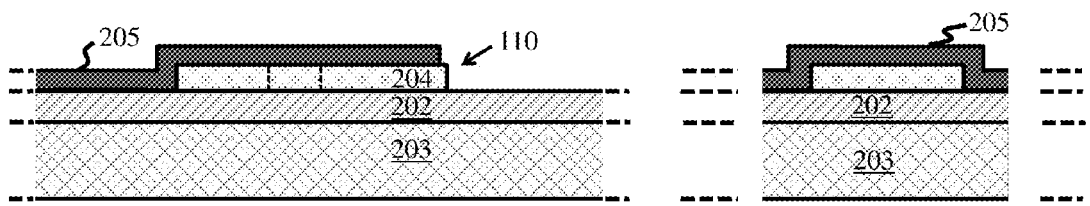
Figure 2E:
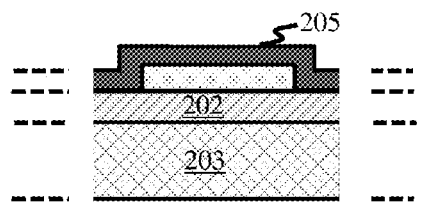
Figure 2F:
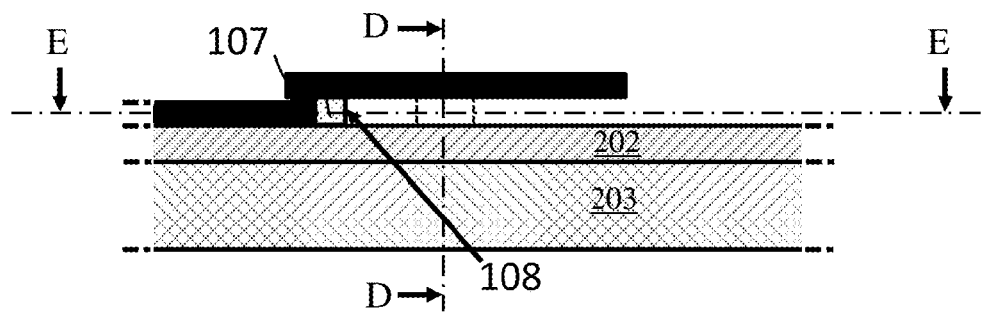

Next, as illustrated in FIG. 2d, an opening 110 is formed in the cavity structure, e.g. by lithographic processing, to expose the nanowire 204. A first portion of the nanowire 204 is then etched away via the opening 110, e.g. by XeF2 vapor, high-temperature HCL vapor etching, or wet-etching in a suitable etchant. This stage is illustrated in FIG. 2f. The remaining portion of nanowire 204 provides as first seed the Si seed 107 with a first seed surface 108 for subsequent growth of the first semiconductor structure. The surface orientation of the exposed first seed surface 108 can be well tailored by choosing the crystal orientation of the seed material and the wet etchant. If the surface orientation of the seed material is along (110), vertical (111) seed surfaces can be obtained, while for more common (100) surface orientation the (111) seed surface will be inclined. The first seed surface 108 may have a limited first seed surface area of order $10^4$ nm$^2$ or less to facilitate a defect free growth of the first semiconductor structure.

The first and second dielectric layers 202, 205 together define the first growth channel 102 and the one or more second growth channels. In this example it is assumed that the first and the second dielectric layers 202 and 205 form a cavity structure with two second growth channels 104a and 104b corresponding to the cavity structure 101 of FIG. 1. The second growth channels 104a and 104b extend perpendicular to the first growth channel 102. This is illustrated in FIG. 2g which shows a cross-section on D-D of FIG. 2f.

As a result a cavity structure is formed corresponding to the cavity structure 101 of FIG. 1a. More particularly, FIG. 1a corresponds to a not to scale simplified cross section on E-E of FIG. 2f.

Figure 2G:
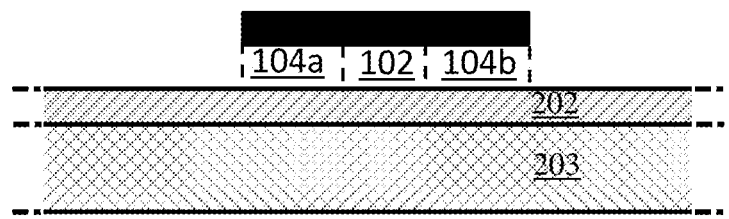

As can be seen in FIGS. 2f and 2g, the first growth channel 102 and the second growth channels 104a and 104b extend laterally over the substrate 203.

Figure 2H:
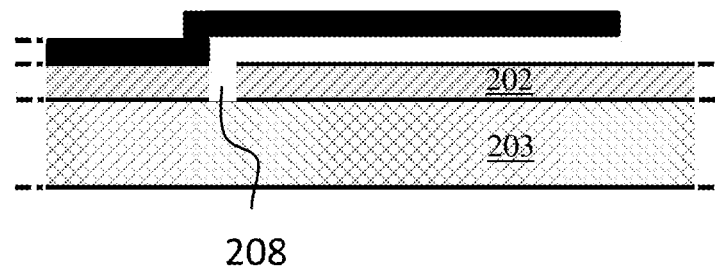

In other methods embodying the invention, the cavity structure can be formed by any convenient processing techniques on a substrate. As an example, the substrate 203 may be used as first seed surface for growing the first semiconductor structure. Such an example is illustrated in FIG. 2h. As can be seen, the dielectric layer 202 comprises an opening 208 with one end reaching the surface of the substrate 203 and the other end reaching the cavity structure. Thereby the first seed is provided by the substrate 203. According to such an embodiment the first semiconductor structure starts growing from the substrate 203 initially in a vertical direction and then the growing of the first semiconductor structure proceeds laterally in the first direction 103.

Prior to the first selective growth step, the Si seed surface 108 is preferably cleaned, by flushing with an HF dip, to remove any surface oxidation.

While the seed surface 108 may be a monocrystalline semiconductor surface, this is not essential. In particular for embodiments where the area of the seed surface is constrained, the seed surface may be provided by a surface of an amorphous or polycrystalline semiconductor or a metal or a metal-semiconductor alloy such as a metal silicide.

After formation of the semiconductor junction, the cavity structure may be removed as desired. e.g. by etching. The structure may then be further optimized, e.g. to refine shape, and subsequent device processing steps may be performed as appropriate to build a required device structure around the semiconductor junction.

The basic fabrication steps described above can be performed using well-known material processing techniques. By way of illustration, details of an exemplary process for fabricating an InAs—GaSb heterojunction on an SOI wafer are described in the following. An SOI wafer with a 17 nm device layer was processed to form the seed material nanowire 204 of FIG. 2b by electron beam lithography and reactive ion etching. The nanowire 204 had a length of 2 μm and dimensions y=25 nm and z=20 nm. A dielectric layer 205 of SiO2 was deposited to a thickness of 100 nm by plasma-enhanced chemical vapour deposition. Opening 110 was formed by electron beam lithography and the seed material was partially removed by a tetramethylammonium hydroxide wet etch to leave the first seed 107 as shown in FIG. 2f. The seed 107 had a length of 0.7 μm. The first semiconductor structure 111 of InAs was then grown by MOCVD using the precursors tertiarybutylarsenic and trimethylindium at a molar flow ratio of 222/2.77 μMol/min=80 at a temperature of 580° C. This produced the first semiconductor structure. The second semiconductor structure of GaSb was then grown by MOCVD using the precursors trimethyantimony and trimethylgallium at a molar flow ratio of 10.6/24 μMol/min=0.4 at a temperature of 550° C. This produced the second semiconductor structure.

FIG. 3a shows another embodiment of a cavity structure 101. In this embodiment the cavity structure 101 comprises a plurality of second growth channels. More particularly, it comprises two second growth channels 104a above the first channel 102 and two second channels 104b below the first channel 102. The two second growth channels 104a and the two second growth channels 104b are arranged in parallel to each other and perpendicular to the first channel 102. Such an arrangement allows growing the second semiconductor structures 112a as well as the second semiconductor structures 112b simultaneously in one epitaxial growth step. Thereby two double semiconductor junctions can be formed simultaneously which are shown in FIG. 3b after removing of the cavity structure 101 and etching away the undesired semiconductor materials.

FIG. 4a shows another embodiment of a cavity structure 101. In this embodiment the first semiconductor channel 102 ends in a T-junction comprising an upper second growth channel 104a and a lower second growth channel 104b. In this embodiment the growing of the first semiconductor structure in the first direction is terminated by the side wall 118 of the cavity 101. Nevertheless, due to the directed anisotropic growth the second seed surfaces 109a and 109b are formed at the channel junctions 106a and 106b as illustrated in FIG. 4a. The final structure after removing of the cavity structure 101 and etching away the undesired semiconductor materials is shown in FIG. 4b.

Figure 5A:
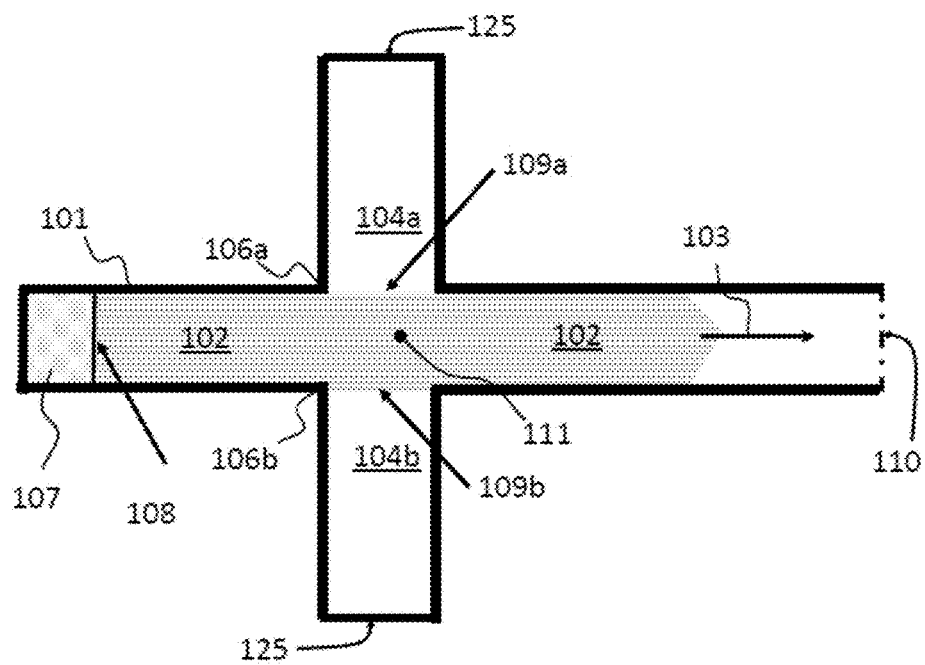
FIGS. 5a and 5b are schematic illustrations showing successive stages in another fabrication method embodying the invention.
Figure 5B:
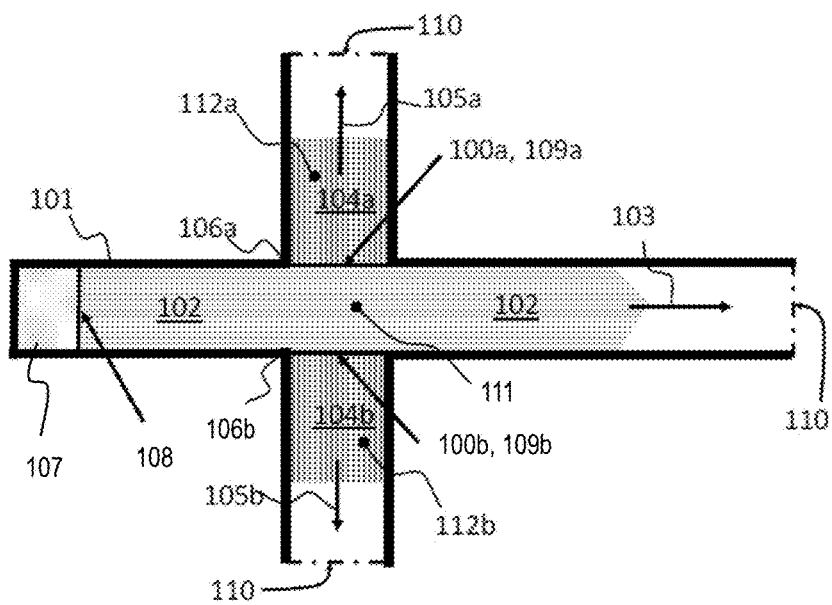

FIGS. 5a and 5b show successive stages of a method for fabrication of semiconductor junctions according to another embodiments of the invention. According to this embodiment the cavity structure 101 comprises initially second growth channels 104a and 104b which are closed by closing structures 125 embodied as walls. In the first growth step of growing the first semiconductor structure 111 in the first channel the closing structures 125 remain closed and accordingly the precursor materials for the first growth step are supplied to the cavity structure 101 only through the opening 110 of the first channel 102. This is shown in FIG. 5a. Such closing of the second growth channels during growth of the first semiconductor structure 111 may facilitate or foster the directed and anisotropic growth of the first semiconductor structure 111. After growing the first semiconductor structure 111 the closing structures 125 may be removed, e.g. in an etching step. Accordingly, the second growth channels 104a and 104b comprise now openings 110 at their ends as illustrated in FIG. 5b. Then for the growth of the second semiconductor structures 112a and 112b the precursor materials can be supplied via these openings 110 to the second growth channels 104a and 104b and the second semiconductor structures 112a and 112b may be grown from the second seed surfaces 109a and 109b.

Figure 6:
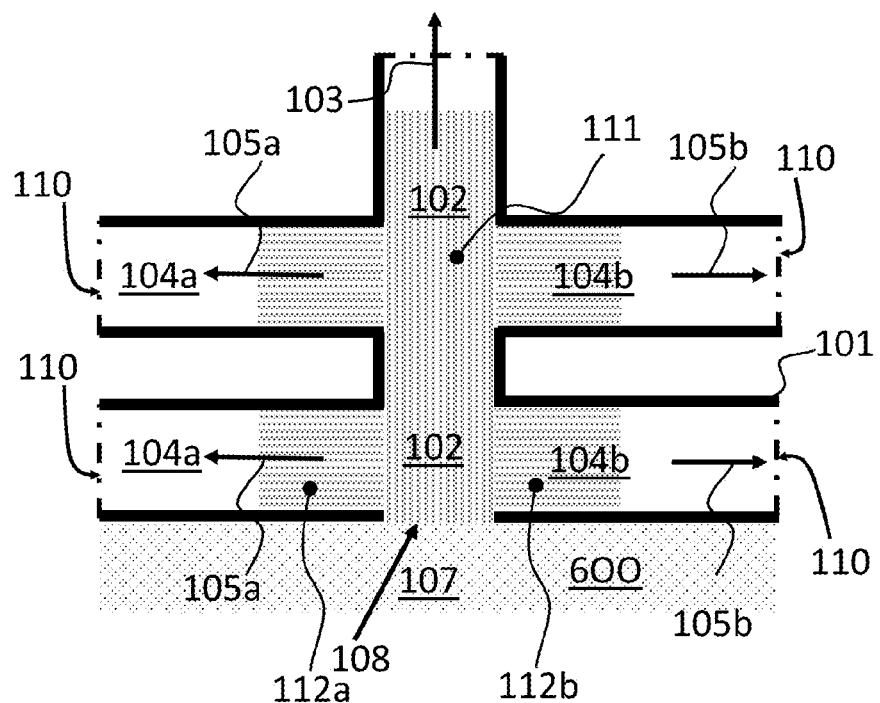
FIG. 6 shows a cavity structure according to another embodiment of the invention according to which a first growth channel and second growth channels are arranged in a vertical stack over a substrate.

FIG. 6 shows a cavity structure 101 according to another embodiment of the invention. In this embodiment a first growth channel 102 and second growth channels 104a and 104b are arranged in a vertical stack over a substrate 600. The substrate 600 provides a first seed surface 108 for growing a first semiconductor structure 111 in the first vertical growth channel 102 only in the first growth direction 103. The first growth direction 103 and the first growth channel 102 extends in this exemplary embodiment vertically from/to the surface of the substrate 600. The second growth channels 104a and 104b extend laterally over the surface of the substrate 600. The directed anisotropic and vertical growth forms second seed surfaces that also extend in a vertical direction along the channel junctions. Then in a subsequent growth step second semiconductor structures 112a and 112b have been formed in the second directions 104a and 104b.

Figures 7A, 7B:
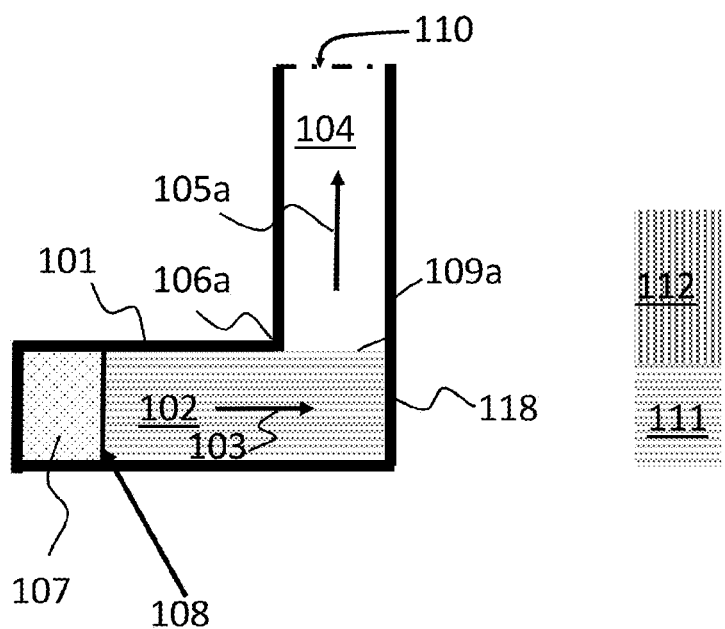

FIG. 7 shows another embodiment of a cavity structure 101. In this embodiment the first semiconductor channel 102 has only a single junction and is connected only to an upper second growth channel 104. In this embodiment the growing of the first semiconductor structure in the first direction is terminated by the side wall 118 of the cavity 101. Nevertheless, due to the directed anisotropic growth the second seed surface 109a is formed at the channel junction 106a. The final structure after removing of the cavity structure 101 and etching away the undesired semiconductor materials is shown in FIG. 7b. It is a single semiconductor junction comprising only the first semiconductor structure 111 and one second semiconductor structure 112.

It should be noted that the above described cavity structures are only exemplary examples and that by appropriate shaping of the cavity structure semiconductors junction may be fabricated with a plurality of desired shapes. As an example, the growth channels can have varying widths and heights and can be curved.

Figure 8:
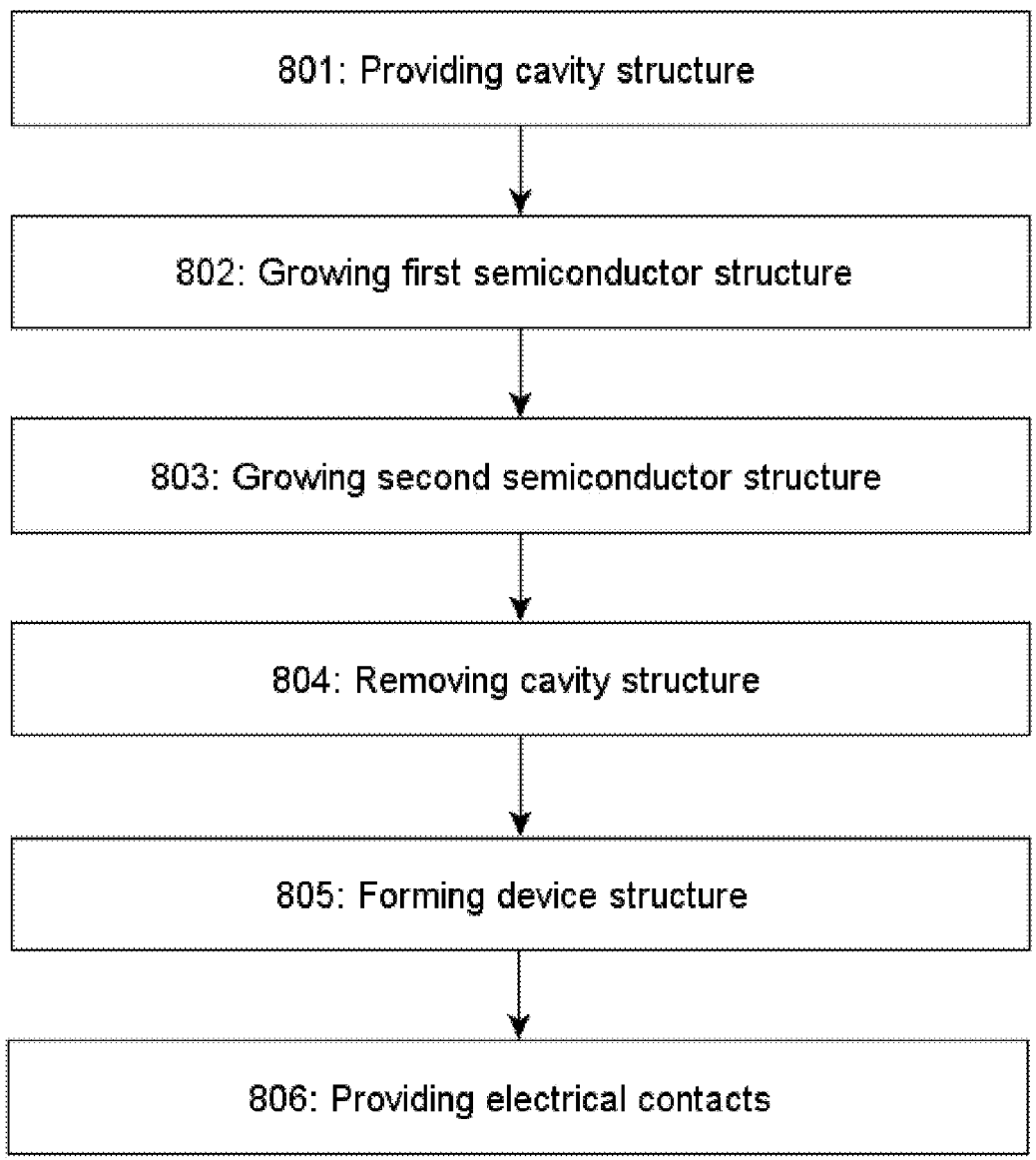
FIG. 8 is a flowchart of methods steps of a fabrication method embodying the invention.

FIG. 8 shows a flow chart of method steps for fabricating a semiconductor junction according to embodiments of the invention.

At a step 801, a cavity structure is provided, e.g. the cavity structure 101 of FIG. 1a.

At a step 802, a first semiconductor structure is selectively grown from the first seed surface in the first direction and in the first channel only, thereby forming a second seed surface for a second semiconductor structure at the channel junction.

At a step 803, a second semiconductor structure is grown in the second channel in the second direction from the second seed surface, thereby forming the semiconductor junction comprising the first and the second semiconductor structure.

At a step 804, the cavity structure is removed as desired, e.g. by etching.

At a step 805, a device structure is formed as desired, e.g. by etching away undesired semiconductor or materials.

Finally, at a step 806 electrical contacts are provided to the formed device structure.

While particular examples have been described above, numerous alternatives and modifications can be envisaged. As an example, embodiments may use other substrates as a starting point for processing, such as a GeOI (Germanium-On-Insulator) wafer, or an XOI wafer having any other semiconductor material on insulator. Alternatively, for example, processing may start from a bulk semiconductor wafer, the surface of which is covered with a dielectric material and patterned to define an opening to the substrate from which a semiconductor seed material can be extended over the dielectric material by an epitaxial growth process, e.g. epitaxial lateral overgrowth. Fabrication processes embodying the invention may in general commence with plain or pre-patterned substrate wafers, i.e. with the seed material already processed. Various other compound semiconductors may be used in the above processes, and other dopant and etchant combinations may be used. The resulting semiconductor junction structures may be further processed if desired, e.g. via additional etching and/or growth stages to produce more complex structures.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device comprising a semiconductor junction, the semiconductor junction comprising:
   a first semiconductor structure grown in a first direction from a first seed in a first cavity, the first semiconductor structure abutting the first seed, the first semiconductor structure comprising a different material from the first seed; and
   a second semiconductor structure grown in a second direction in a second cavity from a seed surface of the first semiconductor structure such that the first semiconductor structure is a second seed abutting the second semiconductor structure, wherein the second direction is perpendicular to the first direction.

2. The semiconductor device according to claim 1, wherein the semiconductor device is a photodiode or a light emitting device.

3. The semiconductor device according to claim 1, wherein a channel junction is formed at an intersection of the first cavity and the second cavity.

4. The semiconductor device according to claim 1, wherein the second semiconductor structure extends to form two arms opposite one another in the second direction in the second cavity.

5. The semiconductor device according to claim 1, wherein the first seed comprises silicon.

6. The semiconductor device according to claim 1, wherein the first semiconductor structure comprises a higher carrier mobility than the first seed.

* * * * *